(12) United States Patent
Zovko

(10) Patent No.: US 6,818,326 B2
(45) Date of Patent: Nov. 16, 2004

(54) EL LAMP WITH FLEXIBLE AREAS

(75) Inventor: Charles I. Zovko, Chandler, AZ (US)

(73) Assignee: Durel Corporation, Chandler, AZ (US)

( * ) Notice: Subject to any disclaimer, the term of this patent is extended or adjusted under 35 U.S.C. 154(b) by 159 days.

(21) Appl. No.: 10/229,977

(22) Filed: Aug. 28, 2002

(65) Prior Publication Data

US 2004/0043191 A1 Mar. 4, 2004

(51) Int. Cl.$^7$ .............................. H05B 33/00; H04M 1/00
(52) U.S. Cl. ........................ 428/690; 428/917; 313/511; 313/512; 313/506; 455/566
(58) Field of Search ................................ 428/690, 917; 313/506, 511, 512; 455/566

(56) References Cited

U.S. PATENT DOCUMENTS

| | | | | | |
|---|---|---|---|---|---|
| 4,730,146 | A | * | 3/1988 | Maser et al. | 313/511 |
| 5,856,030 | A | | 1/1999 | Burrows | 428/690 |
| 2002/0041153 | A1 | * | 4/2002 | Burrows | 313/512 |
| 2003/0048074 | A1 | * | 3/2003 | Ni et al. | 313/512 |
| 2003/0062518 | A1 | * | 4/2003 | Auch et al. | 257/40 |

* cited by examiner

*Primary Examiner*—Dawn Garrett
(74) *Attorney, Agent, or Firm*—Paul F. Wille

(57) ABSTRACT

An EL panel includes a substrate 1–5 mils (0.25–1.26 mm) thick supported by a reinforcing frame screen printed or otherwised deposited in or on the panel.

16 Claims, 2 Drawing Sheets

EL LAMP WITH FLEXIBLE AREAS

BACKGROUND OF THE INVENTION

This invention relates to the combination of a thick film, inorganic, electroluminescent (EL) panel and, in particular, to the construction of an EL panel having relatively thin luminous areas.

As used herein, an EL "panel" is a single sheet including one or more luminous areas, wherein each luminous area is an EL "lamp." An EL lamp is essentially a capacitor having a dielectric layer between two conductive electrodes, one of which is transparent. The dielectric layer can include a phosphor powder or there can be a separate layer of phosphor powder adjacent the dielectric layer. The phosphor powder radiates light in the presence of a strong electric field, using relatively little current.

A modern (post-1990) EL lamp typically includes transparent substrate of polyester or polycarbonate material having a thickness of about 7.0 mils (0.178 mm.). A transparent, front electrode of indium tin oxide or indium oxide is vacuum deposited onto the substrate to a thickness of 1000 Å or so. A phosphor layer is screen printed over the front electrode and a dielectric layer is screen printed over phosphor layer. A rear electrode is screen printed over the dielectric layer. It is also known in the art to deposit the layers by roll coating.

The inks used for screen printing or roll coating include a binder, a solvent, and a filler, wherein the filler determines the nature of the printed layer. A typical solvent is dimethylacetamide (DMAC). The binder is typically a fluoropolymer such as polyvinylidene fluoride/hexafluoropropylene (PVDF/HFP), polyester, vinyl, epoxy or Kynar 9301, a proprietary terpolymer sold by Atofina. A phosphor layer is typically screen printed from a slurry containing a solvent, a binder, and zinc sulphide particles. A dielectric layer is typically screen printed from a slurry containing a solvent, a binder, and particles of titania ($TiO_2$) or barium titanate ($BaTiO_3$). A rear (opaque) electrode is typically screen printed from a slurry containing a solvent, a binder, and conductive particles such as silver or carbon. Because the solvent and binder for each layer are chemically the same or similar, there is chemical compatibility and good adhesion between adjoining layers.

A panel constructed in accordance with the prior art is relatively stiff, even though it is typically only seven mils thick, making it difficult to combine the lamp with a membrane switch, for example, because the EL lamp adversely affects the actuation of the switch. Making an EL lamp as part of a switch has not proven practical, largely for the same reason. There is not a good solution among the many competing trade-offs, including diameter of the bump, height of the bump, stiffness, and tactile feedback. Whether a separate element or part of a membrane switch, an EL panel does not back light the entire area of a key in a keypad. Typically, there is a dark area in the middle of the key.

Layer thickness and stiffness are not directly related. The material from which the layer is made affects stiffness. Typically, EL lamps are made from the materials listed above, which produces an undesirable stiffness. Simply reducing thickness does not provide the desired flexibility.

Relatively flexible EL panels are known in the art. U.S. Pat. No. 5,856,030 (Burrows) discloses a panel made from a urethane layer on a release paper. The release paper provides substantial structural support for the substrate while other layers are applied. Unlike panels made on substrates that are seven mils thick, or so, EL panels made on thin substrates from flexible materials, e.g. urethane one to five mils thick, do not keep their shape but bend or curl. This makes it extremely difficult to automate the assembly of panels into end products, e.g. with a keypad for a cellular telephone.

In view of the foregoing, it is therefore an object of the invention to provide a flexible, self-supporting EL lamp.

Another object of the invention is to provide a relatively thin, self-supporting EL panel.

A further object of the invention is to provide a flexible EL panel that does not affect the actuation of membrane switches located above or below the panel.

Another object of the invention is to provide a flexible EL panel that is compatible with automated assembly equipment.

A further object of the invention is to provide a flexible EL panel that lights the entire area of a key in a keypad overlying the panel.

SUMMARY OF THE INVENTION

The foregoing objects are achieved in this invention in which an EL panel includes a substrate 1–5 mils (0.25–1.26 mm) thick supported by a reinforcing frame printed, coated, deposited or otherwise formed in or on the panel.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
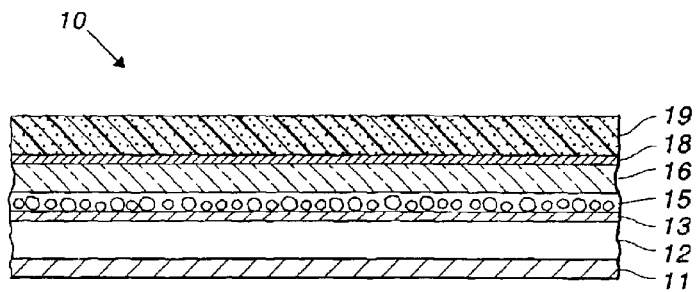
FIG. 1 is a cross-section of an EL lamp constructed in accordance with the prior art.

FIG. 1 is a cross-section of an EL lamp constructed in accordance with the prior art. The various layers are not shown in proportion. In lamp 10, release film 11 supports thin, transparent substrate 12, such as polyurethane. Transparent front electrode 13 overlies substrate 12 and is a thin layer of indium tin oxide or indium oxide. Phosphor layer 15 overlies the front electrode and dielectric layer 16 overlies the phosphor layer. Layers 15 and 16 are combined in some applications. Overlying dielectric layer 16 is opaque rear electrode 18. Optional layer 19 may also be provided, e.g. for sealing lamp 10. Typically, coated phosphor particles are used, eliminating the need for a sealing layer. None of the layers is drawn to scale. Optional layer 19, for example, is 1 mil. (0.025 mm) thick, as are the phosphor layer and the dielectric layer.

Figure 2:
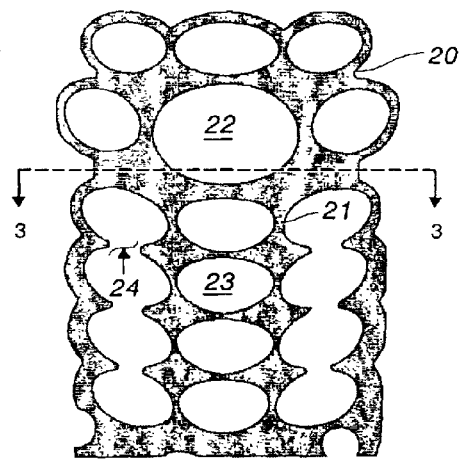
FIG. 2 is a plan view of a reinforcing layer applied to an EL panel in accordance with a preferred embodiment of the invention.

FIG. 2 is a plan view of a reinforcing skeleton or frame. Frame 20 is a separate sheet bonded to a panel, e.g. by adhesive or lamination at the softening temperature of the sheet or of the panel. Preferably, frame 20 is screen printed on an EL panel and then cured. Frame 20 is more rigid than substrate 12 or, when combined with substrate 12, provides greater rigidity or stiffness than the substrate alone. Frame 20 is made from additional polyurethane material or other suitable material that is rigid but not brittle, such as Acheson's Electrodag ML25094 UV Curable Clear. Frame 20 includes a plurality of interstitial runs 21 between and around open areas, such as areas 22 and 23, and has a thickness of 1–10 mils (0.025–0.254 mm).

The open areas may or may not be completely surrounded, depending upon the design of the panel. The open areas correspond to the lamps in a panel. Alternatively, one can make frame 20 opaque and rely on the opacity of the frame to define a plurality of luminous areas from a single, large EL lamp. The open areas are significantly more flexible than frame 20 and do not interfere with the operation of an underlying membrane switch, for example, the keys of which (positioned above frame 20) are completely backlit with no dark areas.

In one embodiment of the invention, a layer of Acheson's Electrodag ML25094 UV Curable Clear was screen printed with an 80 mesh screen on an existing panel that was made using the artwork such as illustrated in FIG. 2. The existing panel was made on a substrate having a thickness of 3 mils. The resulting panel is illustrated in cross-section in FIG. 3.

Figure 3:
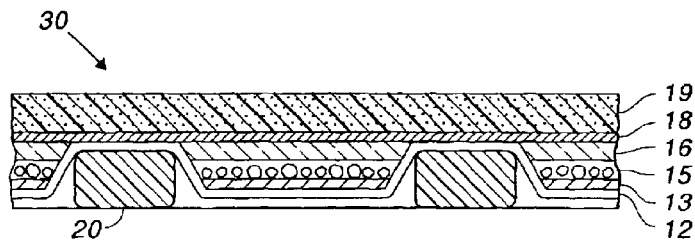
FIG. 3 is a cross-section of an EL lamp constructed in accordance with a preferred embodiment of the invention.

In FIG. 3, frame 20 is printed on the front of the panel, overlying substrate 12. Frame 20 fills in open areas in panel 30 and is approximately as thick as the combined thicknesses of the substrate, front electrode, phosphor layer, and dielectric layer. Using the artwork of FIG. 2, at least four continuous paths exist between the top of frame 20 and the bottom of the frame. Because of gaps, such as gap 24, only three continuous paths exist from one side of frame 20 to the other side. Thus, frame 20 is slightly stiffer in one direction than the other. Even so, panel 30 is substantially more rigid with frame 20 than without the frame and, more importantly, is dimensionally stable, which facilitates automated assembly operations using panel 30 as a component.

Figure 4:
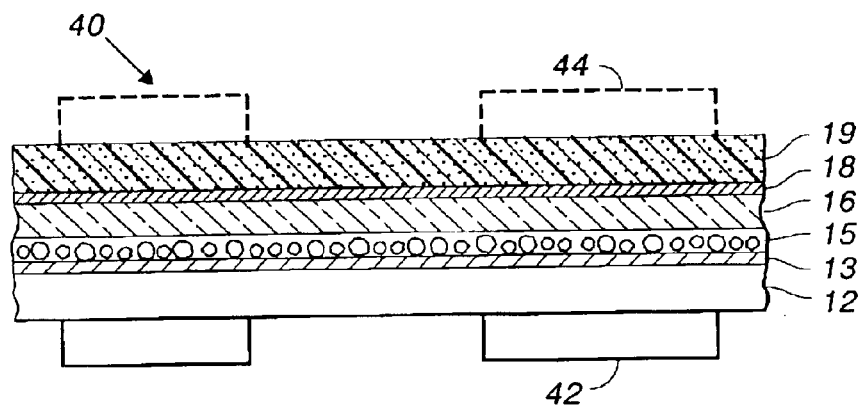
FIG. 4 is a cross-section of an EL lamp constructed in accordance with an alternative embodiment of the invention.

In FIG. 4, frame 20 is applied to the front of EL panel 40 and can be used to define luminous areas if opacifiers are added to the material. As with panel 30 (FIG. 3), panel 40 is constructed from rear to front. As such, there is no release layer overlying substrate 12 and frame 42 is easily added to the front of panel 40. Optionally, frame 44 is added to the rear of panel 40 for further stiffening. Alternatively, panel 40 can be made from front to rear, with frame 44 applied last.

Figure 5:
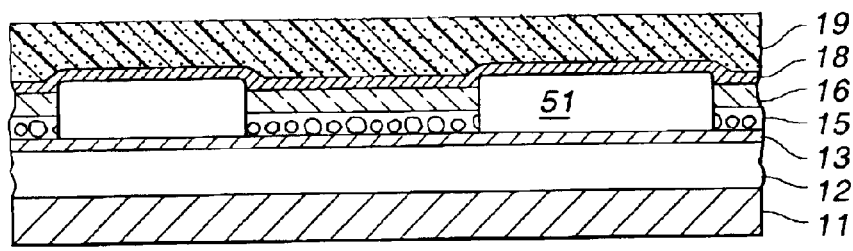
FIG. 5 is a cross-section of an EL lamp constructed in accordance with another alternative embodiment of the invention.

Although the EL panels constructed in accordance with the invention can be made by any suitable means known in the art, screen printing has the advantage of enabling one to incorporate a reinforcing frame into an EL panel. As illustrated in FIG. 5, frame 51 is located between front electrode 13 and rear electrode 18 of EL panel 50. The panel can be built in either direction but, for the sake of example, panel 50 includes substrate 12 that is 3 mils (0.075 mm) or less in thickness supported by release layer 11. Frame 51 is screen printed on front electrode 13 and defines a plurality of open areas. Phosphor layer 15 and dielectric layer 16 are screen printed into the open areas. The entire panel is covered by rear electrode 18, which can be segmented or not, depending upon application, and which can be screen printed or previously formed sheet material. The only requirement of the rear electrode is that it conform to the uneven thicknesses of the underlying layers because frame 51 is thicker (3 mils (0.075 mm) or more) than the combined thicknesses of the phosphor layer and the dielectric layer.

Figure 6:
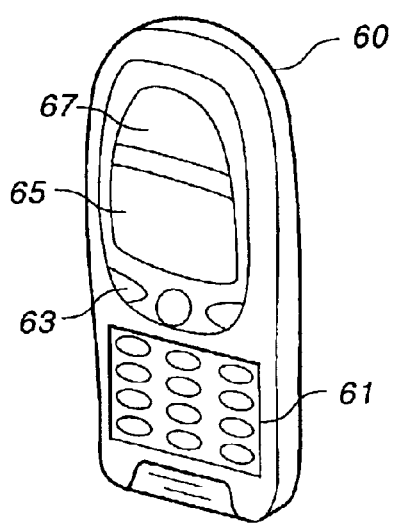
FIG. 6 is a three quarter view of a cellular telephone including an EL panel constructed in accordance with the invention.

In FIG. 6, cellular telephone 60 includes keypad 61 having keys 0-9, ★ (star), and # (pound), and control keys, such as key 63. Information is displayed in display area 65 and area 67 contains a logo or other graphic. In accordance with the invention, all these areas are backlit with a single EL panel containing several lamps, or by a single large lamp, supported by a frame that facilitates assembly of the cell phone. The keys are fully illuminated, providing a highly desirable appearance and improving the legibility of the display. Actuation of the keys is not affected by the EL lamps, further improving the usefulness of the phone.

Having thus described the invention, it will be apparent to those of skill in the art that various modifications can be made within the scope of the invention. For example, a frame can be made to surround all the luminous areas without interstitial runs between areas; i.e. a perimeter frame only. Such would not strengthen the central area of a panel but may be suited to some applications. While described in the context of an ink based, cured layer, the frame could be made separately and laminated to either side of an EL panel. This is not preferred because the dimensional stability of the panel and the frame affect alignment prior to lamination. For screen printed layers, the dimensional stability is in the screen, which is extremely stable.

What is claimed is:

1. In an EL panel having one or more luminous areas on a transparent, flexible substrate 1–5 mils thick, the improvement comprising:

a reinforcing frame in or on the panel for stiffening the EL panel, said frame defining apertures corresponding to said luminous areas.

2. The EL panel as set forth in claim 1 wherein said reinforcing frame includes a screen printed layer 1–10 mils thick.

3. The EL panel as set forth in claim 1 wherein said reinforcing frame is made from a sheet of material that is adhesively bonded to said EL panel.

4. The EL panel as set forth in claim 1 wherein said reinforcing frame includes a UV curable urethane.

5. The EL panel as set forth in claim 1 wherein said reinforcing frame overlies said substrate.

6. The EL panel as set forth in claim 5 wherein said reinforcing frame is substantially opaque.

7. The EL panel as set forth in claim 1 wherein EL panel includes a rear electrode and said reinforcing frame overlies said rear electrode.

8. The EL panel as set forth in claim 1 wherein said EL panel includes a transparent front electrode and a rear electrode and wherein said reinforcing frame is located between said front electrode and said rear electrode.

9. The EL panel as set forth in claim 1 wherein said EL panel includes a plurality of luminous areas and said frame includes interstitial runs between at least some of said luminous areas.

10. In a cellular telephone having at least one display backlit by an EL panel the improvement comprising:

said EL panel includes a flexible substrate and a frame for stiffening the substrate:

said frame defining at least one aperture corresponding to a luminous area of said panel, whereby said EL panel includes at least one flexible, luminous area.

11. The cellular telephone as set forth in claim 10 wherein said EL panel includes a plurality of luminous areas and said frame includes interstitial runs between at least some of said luminous areas.

12. The cellular telephone as set forth in claim 10 wherein said frame includes a screen printed layer 1–10 mils thick.

13. The cellular telephone as set forth in claim 10 wherein said frame is made from a sheet of material that is adhesively bonded to said EL panel.

14. The cellular telephone as set forth in claim 10 wherein said frame overlies said substrate.

15. The cellular telephone as set forth in claim 10 wherein EL panel includes a rear electrode and said frame overlies said rear electrode.

16. The cellular telephone as set forth in claim 10 wherein said EL panel includes a transparent front electrode and a rear electrode and wherein said frame is located between said transparent front electrode and said rear electrode.

\* \* \* \* \*